(12) United States Patent
Xue et al.

(10) Patent No.: US 6,229,678 B1
(45) Date of Patent: May 8, 2001

(54) MAGNETORESISTIVE READ SENSOR

(75) Inventors: Song Sheng Xue, Edina; Patrick J. Ryan, St. Paul; James F. Dolejsi, Chanhassen, all of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/011,631
(22) PCT Filed: Jan. 7, 1998
(86) PCT No.: PCT/US98/00157
§ 371 Date: Jan. 7, 1999
§ 102(e) Date: Jan. 7, 1999
(87) PCT Pub. No.: WO98/41980
PCT Pub. Date: Sep. 24, 1998

Related U.S. Application Data
(60) Provisional application No. 60/041,268, filed on Mar. 18, 1997.

(51) Int. Cl.[7] .................................................. G11B 5/139
(52) U.S. Cl. ........................................................ 360/327.22
(58) Field of Search .................................... 360/113, 126, 360/327.22; 338/32 R; 324/207.21, 252

(56) References Cited

U.S. PATENT DOCUMENTS

| | | |
|---|---|---|
| 5,657,191 | 8/1997 | Yuan ..................................... 360/113 |
| 5,754,376 | 5/1998 | Kobayashi et al. .................. 360/113 |

*Primary Examiner*—George J. Letscher
(74) *Attorney, Agent, or Firm*—Kinney & Lange, P.A.

(57) ABSTRACT

An improved magnetoresistive read sensor (100) and a method of fabricating magnetoresistive read sensor (100) that eliminates film removal is disclosed. The magnetoresistive sensor (100) is formed by positioning a first mask (128) on a gap layer (104) split into three regions due to subsequent layers. A first mask (128) is positioned on the central region of the gap layer (104) and a first hard-biasing material (106) is deposited onto the outside regions of the gap layer (104). The first mask (128) is removed and a magnetoresistive element (116) is deposited onto the outside regions of the first hard-biasing material (106) and the central region of gap layer (104), thereby forming an active region (122), a first passive region (124) and a second passive region (126) of the magnetoresistive sensor (100). A spacer layer (118) is deposited onto the magnetoresistive element (116) in all three regions and a soft adjacent layer (120) is deposited onto the spacer layer (118) in all three regions. A second mask (134) is positioned over the active region (122) of the sensor and a second hard-biasing material (110) is deposited onto the soft adjacent layer (120) in the first passive region (124) and the second passive region (126). The second mask (134) is removed and contacts (112, 114) are positioned onto the second hard-biasing material (110).

10 Claims, 4 Drawing Sheets

MAGNETORESISTIVE READ SENSOR

This Application claims the priority benefit of a Provisional U.S. patent Application having application Ser. No. 60/041,268, filed on Mar. 18, 1997.

BACKGROUND OF THE INVENTION

The present invention relates generally to a magnetoresistive (MR) sensor. More specifically, the present invention relates to an MR read sensor and a method of fabricating the sensor that eliminates the removal of film from the passive regions of the sensor and reduces the coupling dependence between thin film layers.

Magnetoresistive (MR) sensors utilize an MR element to read magnetically encoded information from a magnetic medium, such as a disc, by detecting magnetic flux stored on the magnetic medium. An MR sensor must contain both longitudinal bias and transverse bias to maintain the sensor in its optimal operating range so that it can properly detect the magnetic flux. The dual biasing is established through various combinations of exchange or magnetostatic biasing schemes.

The three critical layers of an MR sensor are the MR element, a spacer material and a soft adjacent layer (SAL). The MR element has magnetoresistive properties and low resistivity and generates an output voltage when a sense current flows through the layer. The SAL is a magnetic bias layer with high resistivity. The SAL biases the magnetization of the MR element and establishes transverse biasing. The spacer material has non-magnetic properties and high resistivity and functions as a spacer between the MR element and SAL. The spacer material helps break the exchange coupling between the MR element and the SAL, which allows the magnetic layers to act as two distinct layers, rather than one strongly coupled layer. Hard-biasing material is placed on each end of the MR sensor, to establish longitudinal biasing and form two passive regions of the sensor. The space between the passive regions maintains the transverse biasing and is referred to as the active region of the sensor.

MR elements can "fracture" into multiple magnetic domains when they are exposed to an external magnetic field. To maximize the stability and output of the MR sensor, it is desirable to maintain the MR element in a single domain state. Three methods for maintaining the MR element in a single domain state are magnetostatic coupling, ferromagnetic exchange coupling and antiferromagnetic exchange coupling. Magnetostatic coupling is accomplished by positioning a permanent magnet adjacent to the MR element. Exchange coupling is accomplished by depositing a ferromagnetic or antiferromagnetic layer adjacent to the MR layer so that one of the magnetic lattices of the magnetic layer couples with the magnetic lattice of the MR element layer to preserve the single domain state of the sensor.

In existing MR sensors, alignment tolerances between various thin film layers and MR sensor mask features are critical. The alignment tolerances in many prior art MR sensor designs greatly increases the complexity of processing because critical geometries frequently require additional and/or more difficult processing steps. Additional processing steps increase the variance and contamination of the various thin film layers.

For example, designs using continuous MR element and SAL films in both the active and passive areas of the sensor are sensitive to the underlayer of the film. In the passive region of the sensor, the SAL film functions as the underlayer for hard-biasing Cobalt-based alloy films. Cobalt-based hard-biasing films are inherently sensitive to the underlayer crystal texture and to the cleanness and roughness of the SAL/Cobalt-alloy film interface. Also in the passive region, the Cobalt-alloy film functions as the underlayer for the MR element. The MR element is sensitive to various factors such as the underlayer crystal texture, cleanness and roughness of the Cobalt-alloy film/MR element interface. The dependence of one film to the other makes the process control inherently difficult in fabricating this type of sensor.

In addition, processes involving reactive ion etching or ion milling often require stopping within a very small tolerance, such as 50 Angstroms. These processes leave the surface of the film layer compromised and affect the exchange coupling. The dependence of one film to an adjacent film makes exchange coupling very critical and affects the overall stability of the MR sensor.

One method for simplifying the process of making an MR sensor is by utilizing an abutting magnetoresistive head. The abutted head appears simple with respect to sensor fabrication. Essentially, a thin MR layer extends over the central active region and a hard-magnetic material is formed over the passive regions. The reliability of the sensor, however, is affected by the abutted junctions between the passive and active regions, which introduce complications in the magnetic and electrical properties at these junctions.

Therefore, there is a continuing need for an MR sensor that reduces the coupling dependence of adjacent films and eliminates the process of reactive ion etching or ion milling various layers, thus decreasing the variance and contamination of thin film layers.

BRIEF SUMMARY OF THE INVENTION

The present invention is a magnetoresistive (MR) sensor that reduces the processing variance and contamination of films fabricated using separate film depositions. The method of the present invention eliminates the process of etching or ion milling various layers and thus no film surfaces are left compromised and the exchange coupling between various film layers is enhanced. In addition, the critical layers, which include the MR element, spacer layer and soft adjacent layer (SAL), are deposited together which allows better control of the thicknesses and coupling of the materials.

The method of making an MR sensor in accordance with the present invention comprises enclosing a tri-layer stack of films by two longitudinal hard-biasing films. The tri-layer stack of films includes an MR layer, a spacer layer and a SAL layer. Fabrication of the sensor includes positioning a first mask on a portion of a gap layer to cover a central active region of the sensor, which leaves two outside regions separated by the central region. A first hard-biasing film is deposited onto the first mask and the outside regions of a gap layer. The first mask is removed and the MR element is deposited onto the central region of the gap layer and the hard-biasing materials, thereby forming two passive regions of the sensor separated by an active region. The spacer layer is deposited onto the MR element in all three regions and the SAL is deposited onto the spacer layer in all three regions. A second mask is positioned over the active region of the sensor and a second hard-biasing material is deposited onto the second mask and onto the SAL in the passive regions of the sensor. The second mask is removed and contacts are positioned onto the second hard-biasing material.

DETAILED DESCRIPTION OF THE PREFERRED EMBODIMENTS

Figure 1:
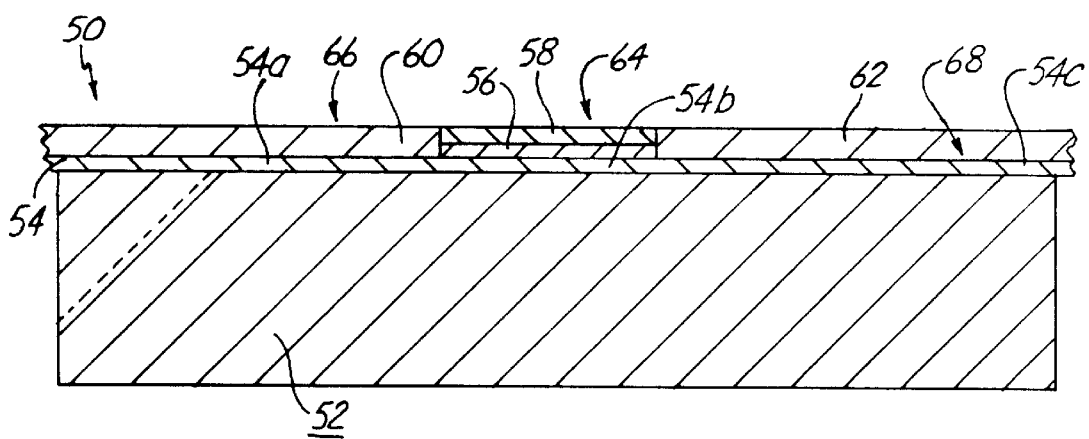
FIG. 1 is a sectional view of a prior art magnetoresistive read sensor in which the spacer and soft adjacent layers are positioned only in the central active region.

FIG. 1 is a sectional view of the reader portion of prior art magnetoresistive (MR) sensor 50. The sectional view shown in FIG. 1 is taken from a plane parallel to the air bearing surface of the sensor. In other words, the air bearing surface of MR sensor 50 is parallel to the plane of the page.

MR sensor 50 is positioned on top of gap layer 52 and includes MR element 54, spacer layer 56, soft adjacent layer (SAL) 58, and first and second permanent magnets or hard-biasing materials 60 and 62. MR element 54 includes first passive region 54a, second passive region 54c, and active region 54b, which is positioned between passive regions 54a and 54c. Hard-biasing material 60 is positioned at least partially on top of first passive region 54a of MR element 54. Likewise, hard-biasing material 62 is positioned at least partially on top of second passive region 54c of MR element 54.

Active region 64 of MR sensor 50 is formed between hard-biasing materials 60 and 62 and includes active region 54b of MR element 54, spacer layer 56, and SAL 58. First passive region 66 of MR sensor 50 is formed above first passive region 54a of MR element 54. First passive region 66 includes the portion of MR element 54 located in first passive region 54a and first hard- biasing material 60. Second passive region 68 of MR sensor 50 is formed above second passive region 54c of MR element 54. Second passive region 68 includes the portion of MR element 54 located in second passive region 54c and second hard-biasing material 62.

Spacer layer 56 is positioned between hard-biasing materials 60 and 62 and on top of active region 54a of MR element 54. SAL 58 is positioned on top of spacer layer 56 such that SAL 58 is also located between hard-biasing materials 60 and 62. Hard-biasing materials 60 and 62 provide the boundaries of active region 64 and make contact with spacer layer 56 and SAL 58. Hard- biasing materials 60 and 62 also define the boundaries of the active region 54a of MR element 54.

During fabrication, prior art MR sensor 50 is subjected to various process steps which increase the variance and tolerances of each film layer. Initially, MR element 54, spacer layer 56 and SAL 58 are deposited in all three regions (active region 64 and passive regions 66 and 68) of MR sensor 50. However, portions of spacer layer 56 and SAL 58 are removed from passive regions 66 and 68. First, SAL 58 is subjected to an ion-milling process to remove the portions of SAL 58 not covered by a photoresist. Next, spacer layer 56 is subjected to a reactive ion-etch process to remove the portions of spacer layer 56 not covered by a photoresist. In addition, MR element passive regions 54a and 54b are sputter-etched to remove a small portion of MR element 54 in order to establish a clean surface or underlayer for later deposition of hard-biasing materials 60 and 62. These processing steps are costly and make it difficult to control the magnetic properties of hard-biasing films. Thus, fabrication of a sensor such as sensor 50 is costly and may or may not be within predetermined tolerances.

Figure 7:
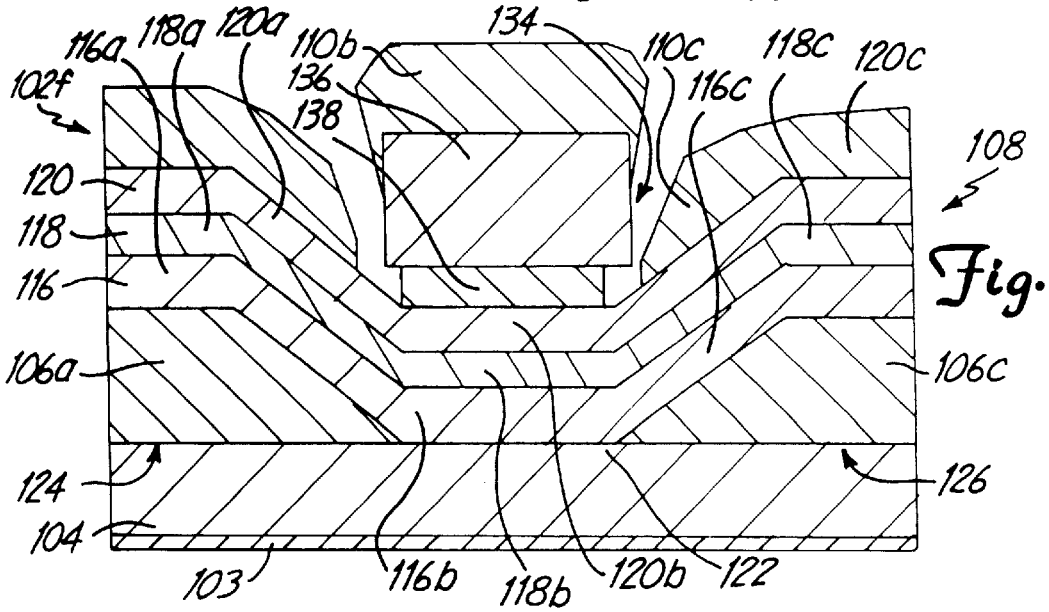
Figure 8:
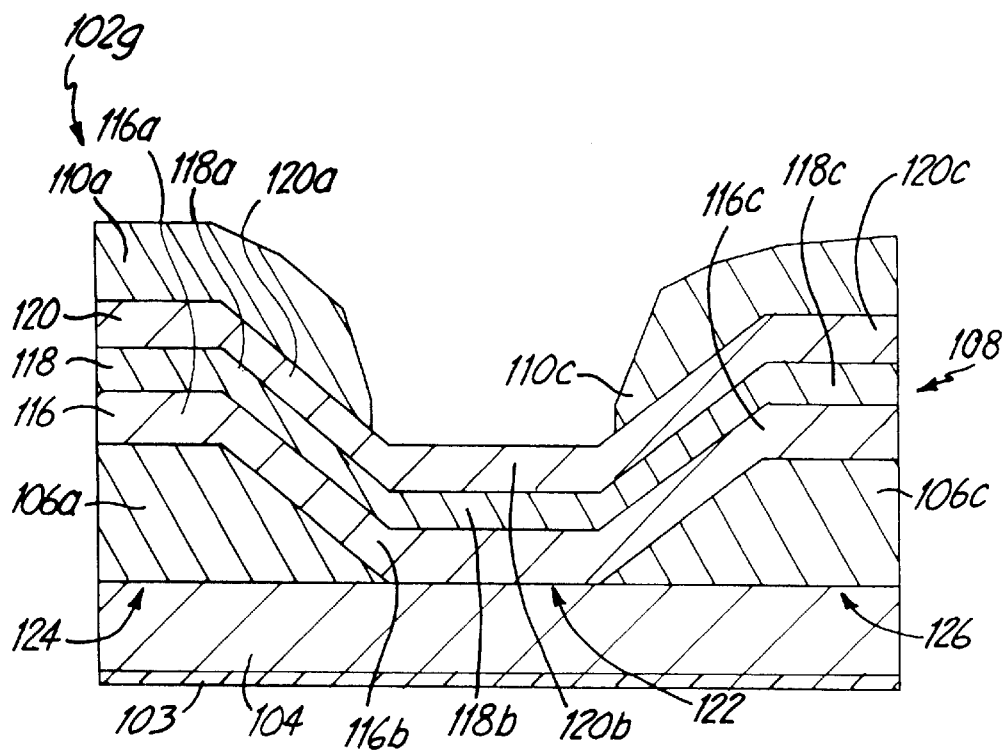
Figure 9:
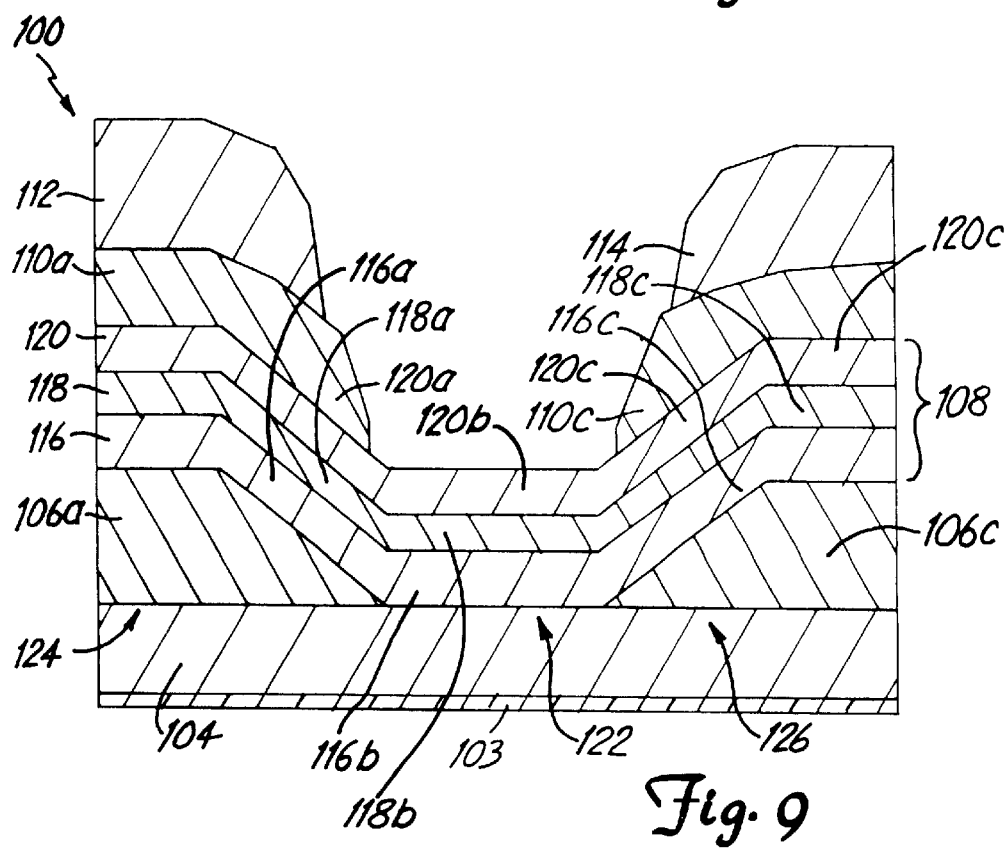

FIGS. 2–9 illustrate a preferred process of forming MR sensor 100 according to the present invention. FIGS. 2–9 show structures 102a–102g at various phases of the fabrication of MR sensor 100, while FIG. 9 shows completed MR sensor 100. The cross-sectional views of FIGS. 2–9 are taken from a plane parallel to the air bearing surface of the sensor. In other words, as with FIG. 1, the air bearing surface of MR sensor 100 is in a plane parallel to the plane of the page.

As shown in FIG. 9, MR sensor 100 is positioned on top of gap layer 104, which is adjacent to bottom shield 103. MR sensor 100 includes hard-biasing material 106 (106a, 106c), tri-layer 108, second hard-biasing material 110 (110a, 110c) and first and second contacts 112 and 114. Tri-layer 108 comprises MR element 116, spacer layer 118 and soft adjacent layer (SAL) 120. Active region 122 of MR sensor 100 is defined by active regions 116b, 118b and 120b of MR element 116, spacer layer 118 and SAL 120, respectively. First passive region 124 of MR sensor 100 is defined by first passive regions 106a, 114a, 116a, 118a and 110a of first hard-biasing material 106, MR element 114, spacer layer 118 and second hard-biasing material 110, respectively, and first contact 112. Second passive region 126 of MR sensor 100 is defined by second passive regions 106c, 114c, 116c, 118c and 110c of first hard-biasing material 106, MR element 114, spacer layer 118 and second hard-biasing material 110, respectively, and second contact 114. In addition, first mask 128, which includes photoresist 130 and PMGI 132, second mask 134, which includes photoresist 136 and PMGI 138, are used to fabricate MR sensor 100.

Figure 2:
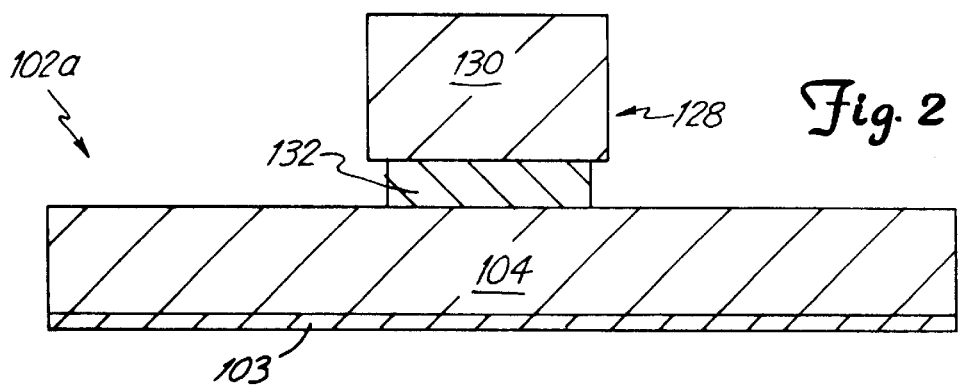
FIGS. 2–9 are sectional views illustrating the process of forming an MR sensor.

As shown in FIG. 2, first mask 128 is positioned above the central area of gap layer 104 to protect the central area from future processing steps. In a preferred embodiment, first mask 128 includes photoresist 130 and PMGI 132, but is not limited to this combination of materials. Gap layer 104 is positioned between bottom shield 103 and MR sensor 100, where bottom shield 103 and gap layer 104 have varying thicknesses. Gap layer 104 is preferably made of a non-magnetic, insulating material with good thermal properties.

Figure 3:
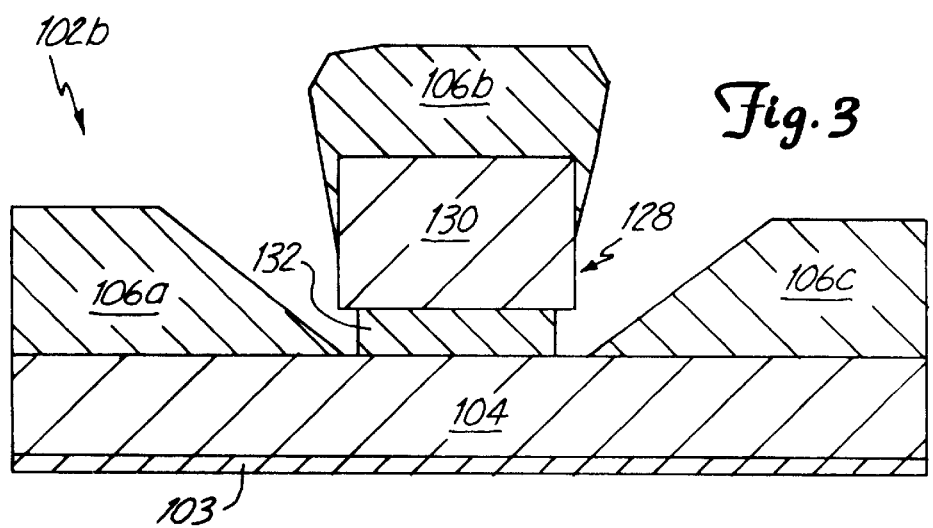

As shown in FIG. 3, first hard-biasing material 106 is deposited over structure 102a, shown in FIG. 2. Due to the configuration of structure 102a, first hard-biasing material 106 forms three distinct sub-materials 106a, 106b, 106c. First hard-biasing material 106b is deposited on top of mask 128, specifically first photoresist 130, and first hard-biasing materials 106a and 106c are deposited on top of gap layer 104 on either side of first mask 128. First hard-biasing material 106 is preferably formed from cobalt-based permanent magnet materials, but other materials can be used. The thickness at the outer edge of materials 106a and 106c is preferably between 200 and 1000 Å.

Figure 4:
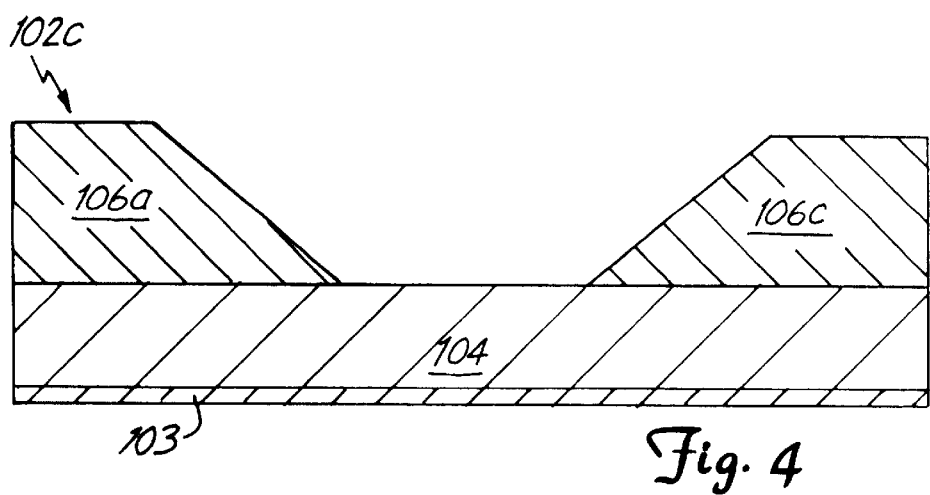

As shown in FIG. 4, first mask 128 has been removed from structure 102b using a lift-off process. The lift-off process removes hard-biasing material 106b and mask 128, including PMGI 132 and photoresist 130. The combination of PMGI and photoresist creates a pattern that provides good "lift-off" of photoresist 130 and any other materials above photoresist 130.

Figure 5:
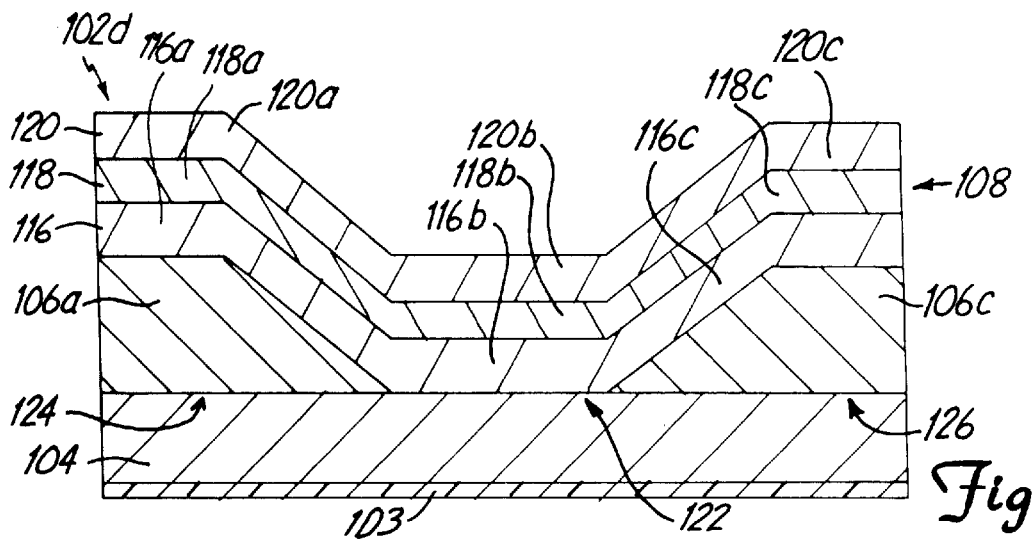

In FIG. 5, the materials of tri-layer 108, comprising MR element 116, spacer layer 118 and SAL 120, are deposited on top of structure 102c, shown in FIG. 4. Active region 122 is defined by the area of tri-layer 108 which is built on top of the central area of gap layer 104, which includes the active regions 116b, 118b and 120b of MR element 116, spacer layer 118 and SAL 120, respectively. Passive regions 124 and 126 of MR sensor 100 are defined by the portions of tri-layer 108 which are built on top of hard-biasing materials 106a and 106c. Thus, the edges of hard-biasing materials 106a and 106c adjacent to the central area of gap layer 104 define the central and passive areas of sensor 100.

The first layer of tri-layer 108 is MR element 116. MR element 116 is deposited on top of the central area of gap layer 104 and on top of first hard-biasing materials 106a and 106c. MR element 116 is, in preferred embodiments, a layer of permalloy. Permalloy is a name commonly used to identify any of a large number of highly magnetically permeable alloys containing a combination of nickel (Ni) and iron (Fe). It must be noted that other magnetoresistive materials can be used instead of permalloy. In preferred embodiments, MR element 116 has a resistivity of less than 100 $\mu\Omega$-cm and a thickness in the range of 25 and 400 Å.

The second layer of tri-layer 108 is spacer layer 118. Spacer layer 118 is deposited on top of MR element 116 in all three regions (116a, 116b, 116c). Spacer layer 118 is a non-magnetic layer of high resistivity material which is positioned between SAL 120 and MR element 116 to prevent magnetic exchange coupling between these two layers. The resistivity of spacer layer 118 is preferably substantially higher than that of MR element 116 so that the majority of the current flows through active region 116a of MR element 116, and increases the output voltage signal from MR element 116. In preferred embodiments, spacer layer 118 is a layer of tantalum (Ta) having a resistivity of at least 100 $\mu\Omega$-cm and a thickness of between 25 and 500 Å.

The third layer of tri-layer 108 is SAL 120. SAL 120 is deposited on top of spacer layer 118 in all three regions (118a, 118b, 118c). SAL 120 is preferably a layer of Sendust-type alloy which is made up of approximately 70 to 90% iron (Fe), up to 15% silicon (Si) and up to 15% aluminum (Al). Sendust-type alloys can also contain small amounts of additional elements, in dilute form, such as up to 5% titanium (Ti), chromium (Cr), vanadium (V), manganese (Mn), and/or zirconium (Zr), to name a few. The Sendust-type alloy forming SAL 120 can be formed in a variety of sputtering gases such as argon, neon, krypton, xenon and helium. SAL 120 can also be a layer of various ferromagnetic materials, for example nickel-iron-rhodium (NiFeRh), nickel-iron-rhenium (NiFeRe), or nickel-iron-chromium (NiFeCr), to name an additional few. In preferred embodiments, SAL 120 has a resistivity of greater than 100 $\mu\Omega$-cm to reduce current flow through the layer. SAL 120 has a preferred thickness of between 25 and 1000 Å and a saturation inductance of at least 3 kilo-Gauss to properly bias MR magnetic layer 116. In preferred embodiments, SAL 120 is a Sendust-type alloy, which provides a good underlayer for second hard-biasing material 110.

While FIGS. 5–9 show SAL 120 positioned on spacer 118 which is positioned on MR element 116, it is understood the SAL 120 and MR element 116 may be interchanged. It is only critical that spacer 118 be positioned between MR element 116 and SAL 120.

Figure 6:
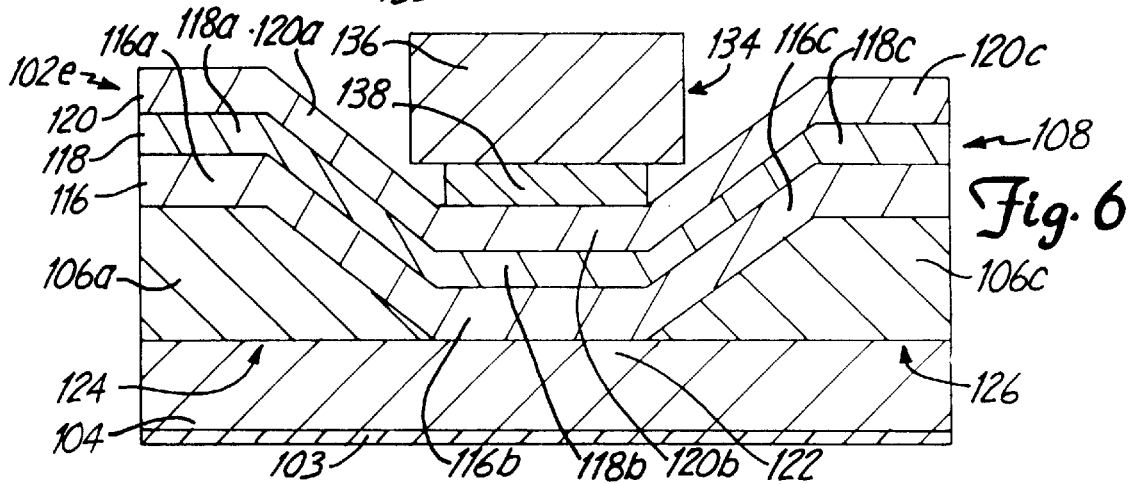

In FIG. 6, second mask 134 is positioned over active region 122 of structure 102e, shown in FIG. 5. Second mask 134 preferably includes photoresist 136 and PMGI 138.

In FIG. 7, second hard-biasing material 110 is deposited over structure 102e, shown in FIG. 6. Due to the configuration of structure 102e, second hard bias material 110 forms three distinct sub-materials 110a, 110b, 110c. Second hard-biasing material 110b is deposited on top of second mask 134 and second hard-biasing materials 110a and 110c are deposited on top of tri-layer 108, more specifically SAL 120, over first and second passive regions 120a and 120c of SAL 120. Hard-biasing material 110 is preferably formed from cobalt-based permanent magnet materials, but other materials can be used. In preferred embodiments, the thickness of hard-biasing material 110 at the outer edge of materials 110a and 110c is between 200 and 1000 Å.

In FIG. 8, second mask 134 is removed using a lift-off process. The lift-off process removes photoresist 136 and PMGI 138. In addition, hard-biasing material 110b is removed with second mask 134. Similar to first mask 128, the combination of PMGI and photoresist creates a pattern which provides good "lift-off" of photoresist 136.

In FIG. 9, contacts 112 and 114 are deposited on top of passive regions 110a and 110c of hard-biasing material 110. The contacts connect MR sensor 100 to external circuitry for current input.

In preferred embodiments, transverse biasing is desired in active region 116b of MR element 116 and longitudinal biasing is desired in first and second passive regions 116a and 116c of MR element 116. MR element 116 is transverse biased when its magnetization vector is rotated using soft-film biasing, shunt biasing or any other compatible transverse bias technique. Longitudinal biasing is established using longitudinal hard-biasing films, such as cobalt-platinum, which suppress multiple domain formation in MR elements.

When MR element 116 is deposited, it will naturally form magnetization vector M along its long axis across the plane of the paper. Current density vector J is formed in MR element 116 as current passes through MR sensor 100 during operation. Current density vector J and magnetization vector M initially point in the same direction. When magnetization vector M and current density vector J form an angle of approximately 45 degrees, the resistance of MR element 116 will vary nearly linearly with the magnitude of magnetic flux entering MR element 116. Thus, transverse biasing of MR element 116 is desired to obtain optimal conditions for sensing magnetic flux from a disc.

Magnetization vector M is rotated by forming SAL 120 above MR element 116. The magnetic field of SAL 120 causes natural magnetization vector M of MR element 116 to be rotated approximately 45 degrees with respect to the direction of current density vector J. Spacer layer 118 is deposited between MR element 116 and SAL 120 to prevent magnetic exchange coupling between the layers, thereby permitting the rotation of magnetization vector M.

First and second passive regions 116a and 11 6c of MR element 116 are inhibited from magnetic rotation by the high coercivity, low permeability of first hard-biasing materials 106a and 106c, respectively, through exchange coupling. The exchange coupling causes longitudinal biasing or suppression of the magnetic rotation because the geometries of MR element 116 and first hard-biasing material 106 align. Inhibiting the magnetic rotation allows very little magnetic flux into first and second passive regions 116a and 116c, which establishes a well defined reader track width and increases the absorption of flux into active region 116b.

SAL 120 is located in all three regions of MR sensor 100, active region 120b and passive regions 120a and 120c, but only active region 120b of SAL 120 is needed to transverse bias the active region 116b of MR element 116. Therefore, SAL is also longitudinally biased in passive regions 120a and 120c using second hard-biasing material 110. The exchange coupling between second hard-biasing material 110 and SAL 120 suppresses the magnetic field in passive regions 120a and 120c of SAL 120.

The amount and effectiveness of exchange coupling that exists between first and second hard-biasing materials 106 and 110 and MR element 116 and SAL 120, respectively, depends upon a number of fabrication parameters. For instance, the material of MR element 116 or SAL 120, the material of hard-biasing materials 106 and 110, the thickness of MR element 116 or SAL 120, the thickness of hard-biasing materials 106 and 110 and the ratio between the thicknesses of materials all contribute to the effectiveness of exchange coupling. Deposition parameters such as sputtering pressure and temperature and post-deposition fabrication parameters such as ion-milling or etching also contribute to the effectiveness of exchange coupling. In addition to thickness and deposition parameters, the underlayer of each film affects exchange coupling. Cobalt-based hard-biasing materials are inherently sensitive to the underlayer crystal texture, cleanness and roughness of the interfacing films. The dependence of one film to the other makes fabrication difficult.

The present invention eliminates post-deposition steps such as ion milling or etching. Spacer layer 118 and SAL 120 are not removed from first and second passive regions 124 and 126 of MR sensor 100. This eliminates the need to stop within very small tolerances and avoids leaving the surface of film layers compromised. Therefore, better exchange coupling can take place between layers without the need for additional processing steps.

The underlayer of hard-biasing materials 106 and 110 and MR element 116 are improved by taking advantage of the order in which the films are deposited. A desirable underlayer, such as amorphous Sendust or chromium, is chosen to control the characteristics of hard-biasing materials 106 and 100 and MR element 116. For example, SAL 120 forms a good underlayer for second hard-biasing material 110 when SAL 120 is made of a Sendust-type alloy.

MR elements can "fracture" into multiple magnetic domains when they are exposed to an external magnetic field. To maximize the MR sensor's output and stability, it is desirable to maintain the MR element in a single domain state through exchange coupling or magnetostatic coupling. The magnetic field of the hard-biasing material should be large enough to ensure a single domain configuration, yet small enough so as not to change the linearity and signal amplitude of the resultant MR signal.

In operation, the air bearing surface of MR sensor 100 would be positioned adjacent to a magnetic storage medium. The magnetic storage medium is rotated so that the magnetic information located in the storage medium passes by the active region of the MR sensor. A sense current flows through MR element 116. It is desirous to have an appropriate amount of sense current flow through magnetic layer 116 of MR sensor 100, in order to more effectively read information stored on the magnetic storage medium. Once the sense current has flowed through MR sensor 100, auxiliary circuitry manipulates the MR sensor output in order to recover stored data from the magnetic storage medium.

Although the present invention has been described with reference to preferred embodiments, workers skilled in the art will recognize that changes may be made in form and detail without departing from the spirit and scope of the invention.

What is claimed is:

1. A magnetoresistive read sensor comprising:
   a first hard-biasing film positioned on a first region and a third region of a gap layer, wherein the first and third regions are separated by a second region;

a magnetoresistive element positioned on top of the first hard-biasing film and on top of the second region of the gap layer, thereby forming a first and a second passive region of the sensor separated by an active region;

an unetched and unmilled spacer layer positioned on top of the magnetoresistive element, which extends over the active region and the first and second passive regions;

an unetched and unmilled soft adjacent layer positioned on top of the spacer material, which extends over the active region and the first and second passive regions, the soft adjacent layer establishing transverse biasing for the magnetoresistive element; and a second hard-biasing film positioned on top of the first and second passive regions.

2. The magnetoresistive read sensor of claim 1 and further comprising a plurality of contacts positioned on top of the second hard-biasing film.

3. The magnetoresistive read sensor of claim 1 wherein the magnetoresistive element is formed from a soft-magnetic material having a resistivity less than 100 $\mu\Omega$-cm.

4. The magnetoresistive read sensor of claim 1 wherein the spacer material is formed from a non-magnetic material having a resistivity of at least 100 $\mu\Omega$-cm.

5. The magnetoresistive read sensor of claim 1 wherein the soft adjacent material is formed from a soft-magnetic material having a resistivity of at least 100 $\mu\Omega$-cm.

6. A magnetoresistive read sensor assembly comprising:
   a first hard-biasing film positioned oil a first region and a third region of a gap layer, wherein the first and third regions are separated by a second region;

a magnetoresistive layer, a spacer layer and a soft adjacent layer positioned on top of the first hard-biasing film and on top of the second region of the gap layer, thereby creating an active region located above the gap layer and a first and a second passive region located above the hard-biasing film, wherein the spacer layer is fabricated between the magnetoresistive layer and the soft adjacent layer and has an essentially uniform thickness and composition, and wherein the soft adjacent layer has an essentially uniform thickness and composition and establishes transverse biasing for the magnetoresistive element; and a second hard-biasing film positioned on top of the soft adjacent layer in the first and second passive regions.

7. The magnetoresistive read sensor of claim 6 and further comprising a plurality of contacts positioned on top of the second hard-biasing film.

8. The magnetoresistive read sensor of claim 6 wherein the magnetoresistive element is formed from a soft-magnetic material having a resistivity less than 100 $\mu\Omega$-cm.

9. The magnetoresistive read sensor of claim 6 wherein the spacer material is formed from a non-magnetic material having a resistivity of at least 100 $\mu\Omega$-cm.

10. The magnetoresistive read sensor of claim 6 wherein the soft adjacent layer is formed from a soft-magnetic material with a resistivity of at least 100 $\mu\Omega$-cm.

* * * * *